(12) United States Patent
Yamashita

(10) Patent No.: US 6,835,988 B2
(45) Date of Patent: Dec. 28, 2004

(54) SEMICONDUCTOR DEVICE HAVING CHANNEL CUT LAYERS PROVIDED AT DIFFERENT DEPTHS

(75) Inventor: Tomohiro Yamashita, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 202 days.

(21) Appl. No.: 10/218,447

(22) Filed: Aug. 15, 2002

(65) Prior Publication Data
US 2003/0057498 A1 Mar. 27, 2003

(30) Foreign Application Priority Data
Sep. 21, 2001 (JP) .................................. 2001-288971

(51) Int. Cl.⁷ .............................................. H01L 29/78
(52) U.S. Cl. ...................................................... 257/398
(58) Field of Search ................................ 257/243, 305, 257/349, 398, 399, 400, 519; 438/427, 428

(56) References Cited

U.S. PATENT DOCUMENTS

| | | | | |
|---|---|---|---|---|
| 4,435,895 A | * | 3/1984 | Parrillo et al. | 438/226 |
| 4,717,683 A | * | 1/1988 | Parrillo et al. | 438/451 |
| 5,240,874 A | * | 8/1993 | Roberts | 438/298 |
| 5,472,887 A | * | 12/1995 | Hutter et al. | 438/231 |
| 5,700,730 A | * | 12/1997 | Lee et al. | 438/298 |
| 6,291,851 B1 | * | 9/2001 | Matsumoto et al. | 257/314 |
| 6,518,625 B1 | * | 2/2003 | Nishida et al. | 257/344 |

FOREIGN PATENT DOCUMENTS

| | | | | |
|---|---|---|---|---|
| JP | 59084572 A | * | 5/1984 | ........... H01L/27/08 |
| JP | 62-65374 | | 3/1987 | |
| JP | 64-72523 | | 3/1989 | |

* cited by examiner

Primary Examiner—Carl Whitehead, Jr.
Assistant Examiner—Jennifer M. Dolan
(74) Attorney, Agent, or Firm—Oblon, Spivak, McClelland, Maier & Neustadt, P.C.

(57) ABSTRACT

A semiconductor device includes an element isolating insulation film having different depths depending on locations where it is formed. A plurality of channel cut layers are formed in one active region in a direction of depth.

11 Claims, 16 Drawing Sheets

SEMICONDUCTOR DEVICE HAVING CHANNEL CUT LAYERS PROVIDED AT DIFFERENT DEPTHS

BACKGROUND OF THE INVENTION

1. Field of the Invention

The present invention relates to a MOS (Metal Oxide Silicon) semiconductor device and particularly to a semiconductor device having an element isolation structure with improved isolation properties.

2. Description of the Background Art

One of techniques of performing dielectric isolation between semiconductor elements is trench isolation, in which a trench formed in a surface of a semiconductor substrate is filled with a polysilicon film or silicon oxide film. This structure covers only a very small area with a very low parasitic capacitance, which is thus suitable for high-level integration and speedup of semiconductor devices as compared to other dielectric isolation techniques.

FIGS. 15 and 16 are cross-sectional views each showing a step of a method of manufacturing a conventional semiconductor device. These drawings illustrate a semiconductor substrate 101, a trench 102, silicon oxide films 1021, 1031 and a silicon nitride film 1022. Referring to these drawings, the silicon oxide film 1021 and the silicon nitride film 1022 are first deposited in this order on a surface of the semiconductor substrate 101. The silicon nitride film 1022 and the silicon oxide film 1021 are patterned so as to have an opening on a region where the trench 102 is to be formed by anisotropic etching using a photoresist mask (not shown). The surface of the semiconductor substrate 101 is etched using the silicon nitride film 1022 and the silicon oxide film 1021 as a mask to form the trench 102.

Next, an insulation film such as the silicon oxide film 1031 is formed on the entire surface using a CVD (Chemical Vapor Deposition) technique. The silicon oxide film 1031 on a surface of the silicon nitride film 1022 is then removed by a CMP (Chemical Mechanical Polishing) technique using the silicon nitride film 1022 as a stopper, so that the silicon oxide film 1031 is left only in the insides of the trench 102 and the opening of the silicon nitride film 1022. FIG. 15 shows semiconductor elements at a stage upon completion of this step.

FIG. 16 illustrates a silicon oxide film 103, a p-well 1041, an n-well 1042, a p-channel cut layer 1051, an n-channel cut layer 1052, a gate insulation film 106, a gate electrode 107, an n-type source/drain regions 1081 and a p-type source/drain regions 1082.

Referring to FIG. 16, after the step shown in FIG. 15, the silicon oxide film 103 is formed by removing the silicon nitride film 1022 and the silicon oxide film 1021 and removing the surface of the silicon oxide film 1031. After forming the silicon oxide film 103, a photoresist mask (not shown) having an opening on an nMOS region and a pMOS region is formed, thereby forming the p-well 1041 and the p-channel cut layer 1051, and the n-well 1042 and the n-channel cut layer 1052, respectively.

Next, after removing the photoresist masks, a silicon oxide film and a polysilicon layer are formed on the entire surface and patterned to form the gate insulation film 106 and the gate electrode 107.

Thereafter, another photoresist mask (not shown) having an opening on the nMOS region and the pMOS region is formed, thereby forming the n-type source/drain regions 1081 while n-type impurities are introduced into the gate electrode 107 in the nMOS region, and forming the p-type source/drain regions 1082 while p-type impurities are introduced into the gate electrode 107 in the pMOS region. The photoresist masks are then removed. FIG. 16 shows the semiconductor elements at a stage upon completion of this step.

A trench width decreases with size reduction of elements. This arises a problem that, in anisotropic etching for forming trenches, the etch rate depends on patterns, which results in variation in the depth of the trenches as formed and variation in the surface height of silicon oxide films buried in the trenches. Further, non-uniformity in the surface also disadvantageously causes trench depth variation. Furthermore, when filling the trenches with the silicon oxide films and performing planarization, variation disadvantageously occurs in the surface height of the buried silicon oxide films due to the differences of the trenches in width and the like. This variation disadvantageously creates a region under an isolating insulation film in which no channel cut layer is formed, so that punch-through between elements cannot be prevented in this region.

SUMMARY OF THE INVENTION

An object of the present invention is to provide a semiconductor device having good isolation properties with reduced punch-through between elements in a semiconductor integrated circuit reduced in size.

The semiconductor device according to the present invention includes a first semiconductor region of a first conductivity type, an isolating insulation film, a first channel cut layer of the first conductivity type, a second channel cut layer of the first conductivity type and a plurality of MOS transistors of a second conductivity type. The first semiconductor region of the first conductivity type is provided in a main surface of a semiconductor substrate. The isolating insulation film is provided in the main surface of the semiconductor substrate and separates the first semiconductor region into a plurality of active regions. The isolating insulation film has a bottom surface including first and second bottoms provided at first and second depths different from each other. The first channel cut layer of the first conductivity type is provided in the vicinity of the first bottom at the first depth in the first semiconductor region. The second channel cut layer of the first conductivity type is provided in the vicinity of the second bottom at the second depth in the semiconductor region. The plurality of MOS transistors of a second conductivity type are formed at a main surface of each of the plurality of active regions.

The channel cut layers are formed at different depths even if variation occurs in the depth of the bottom surfaces of the isolating insulation film and in the surface height of the isolating insulation film, and are therefore present in the semiconductor substrate under the isolating insulation film. This allows punch-through between elements to be reduced sufficiently. Consequently, the semiconductor device has good isolation properties.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
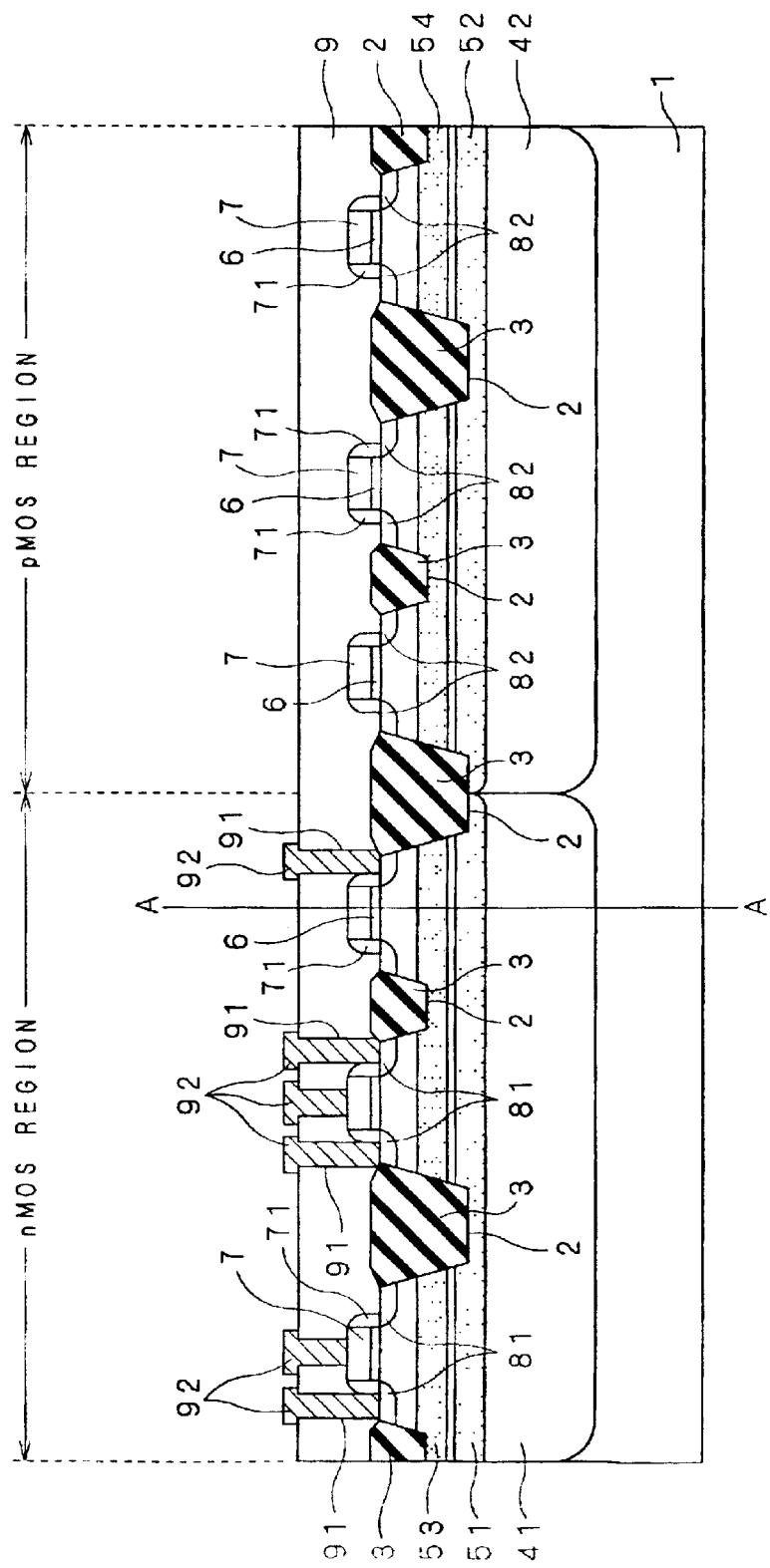
FIG. 1 is a cross-sectional view showing a semiconductor device according to a first preferred embodiment of the present invention.

FIG. 1 is a cross-sectional view showing a semiconductor device according to a first preferred embodiment of the present invention and illustrates a semiconductor substrate 1, a trench 2, an isolating insulation film 3, a p-well 41, an n-well 42, p-channel cut layers 51 and 53, n-channel cut layers 52 and 54, gate insulation films 6, gate electrodes 7, sidewall insulation films 71, n-type source/drain regions 81, p-type source/drain regions 82, an interlayer insulation film 9, contact holes 91 and metal wirings 92. The semiconductor device includes CMOS transistors.

Referring to FIG. 1, the semiconductor substrate 1 includes p- or n-type impurities of 10 Ω·cm in terms of resistivity or approximately $1\times10^{15}$/cm$^3$ in terms of concentration. The trench 2 formed in a surface of the semiconductor substrate 1 is filled with the isolating insulation film 3 such as a silicon oxide film, a silicon nitride film or a silicon oxynitride film to form an isolation region for separating elements from one another. A silicon oxide film, a silicon nitride film, a silicon oxynitride film and the like may be used in combination to form the isolating insulation film 3.

When a transistor has a gate length L of approximately 200 nm, the isolating insulation film 3 has a width of approximately 200 to 500 nm and a film thickness of approximately 150 to 500 nm. However, the isolating insulation film 3 may have a width of approximately 5000 nm depending on the location. In that case, the width of the isolating insulation film 3 is adjusted, for example, by leaving the semiconductor substrate 1 (as a dummy pattern) also in a region in which elements are not to be formed so as to reduce surface irregularities (non-uniformity) of the semiconductor substrate 1 and the isolating insulation film 3.

In active regions separated by the isolating insulation film 3, impurities are introduced into the surface of the semiconductor substrate 1 as necessary, thereby forming the p-well 41 and the n-well 42. The p-well 41 includes impurities such as boron with a concentration peak of approximately $5\times10^{17}$ to $5\times10^{18}$/cm$^3$ in its bottommost part. The concentration peak is formed at a depth of approximately 0.5 to 1.0 μm from the surface of the semiconductor substrate 1. The n-well 42 includes impurities such as phosphor with a concentration peak of approximately $5\times10^{17}$ to $5\times10^{18}$/cm$^3$ in its bottommost part. The concentration peak is formed to present at a depth of approximately 0.5 to 1.0 μm from the surface of the semiconductor substrate 1.

The p-well 41 is further provided with the channel cut layers 51 and 53 on the side of the surface of the semiconductor substrate 1 (at a shallow position), each of which includes impurities such as boron with a concentration peak of approximately $1\times10^{17}$ to $1\times10^{18}$/cm$^3$.

The n-well 42 is further provided with the channel cut layers 52 and 54 on the side of the surface of the semiconductor substrate 1 (at a shallow position), each of which includes impurities such as phosphor with a concentration peak of approximately $1\times10^{17}$ to $1\times10^{18}$/cm$^3$.

The depth of the trench 2 varies depending on its horizontal width (isolation width). The intermediate value of variation in the depth shall be indicated by d and the variation shall be indicated by Δd(>0). In this case, the impurity concentration peaks of the channel cut layers 53 and 54 are positioned at a depth of approximately d−Δd from the surface of the semiconductor substrate 1, and the impurity concentration peaks of the channel cut layers 51 and 52 are positioned at a depth of approximately d+Δd from the surface of the semiconductor substrate 1. The channel cut layers 53 and 54 are provided such that their impurity concentration peaks are positioned in the vicinity of the depth of d−Δd. The channel cut layers 51 and 52 are provided such that their impurity concentration peaks are positioned in the vicinity of the depth of d+Δd.

Figure 2:
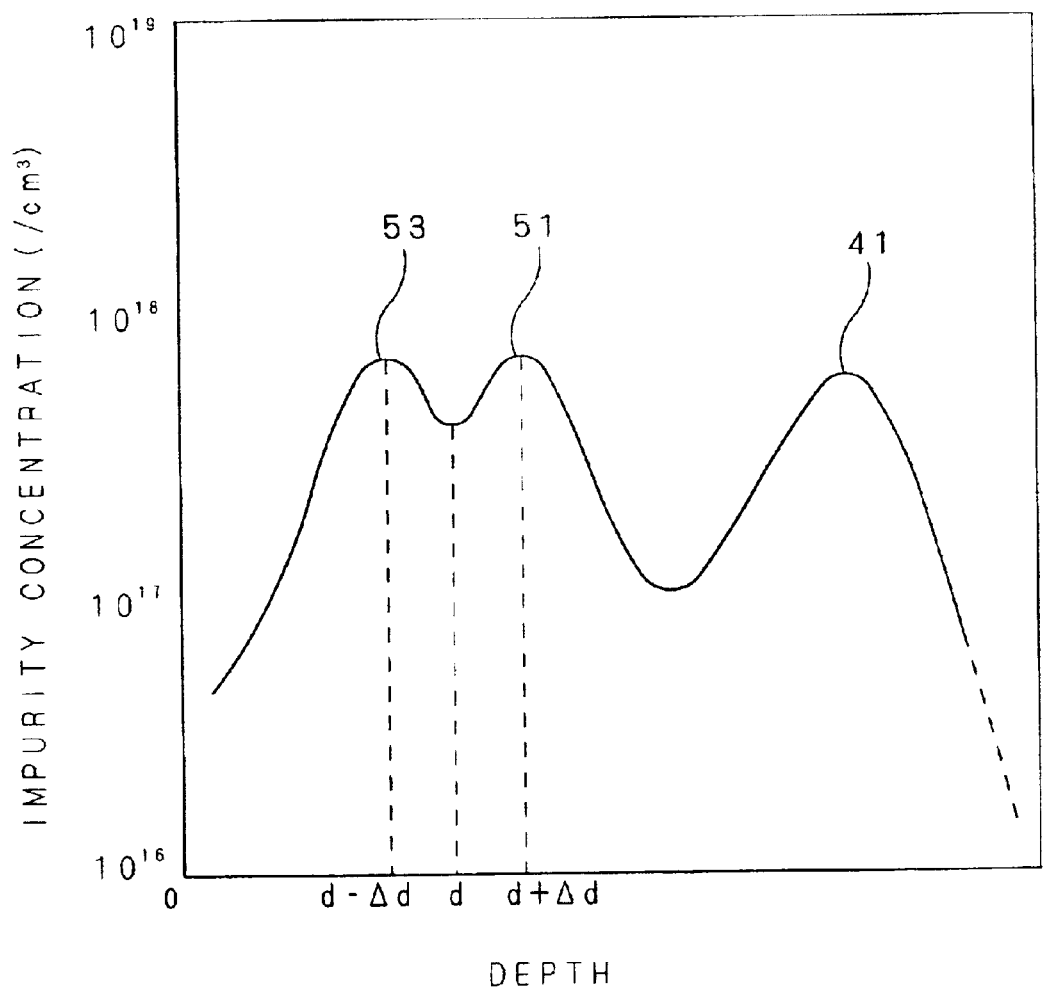
FIG. 2 is a graph showing an impurity concentration distribution of the semiconductor device according to the first preferred embodiment.

FIG. 2 is a graph showing impurity concentration distributions of the semiconductor device according to the present embodiment, conceptually showing the impurity concentration distributions in the semiconductor substrate 1 at a section taken along the line A—A shown in FIG. 1. The impurity concentration peaks shown in FIG. 2 are of the channel cut layers 53, 51 and the p-well 41, respectively. In the pMOS region, the channel cut layers 54, 52 and the n-well 42 present similar distributions. Although the graph shows each impurity region presenting clear impurity concentration peaks, such clear concentration peaks may not be presented in some cases.

The intermediate value d of variation in the trench depth is, for example, a design value in an element forming region. The variation Δd has a range of approximately 10 to 20% of the trench depth, and is thus expected to range approximately between 30 and 60 nm when the value d is approximately 300 nm. The channel cut layers 53 and 54 are set to have their impurity concentration peaks at a depth of approximately 240 to 270 nm, and the channel cut layers 51 and 52 are set to have their impurity concentration peaks at a depth of approximately 330 to 360 nm.

Such settings allow the bottom of a trench formed to a depth of approximately 300 nm in accordance with the design value to be maintained at a high concentration by the channel cut layer 53, 54, 51 or 52.

Referring to FIG. 1, in each transistor, a channel doped layer (of a buried channel type) including impurities of the opposite conductivity type to the well or a channel doped layer (of a surface channel type) including impurities of the same conductivity type as the well or the like is formed (not shown) as necessary on the side of the surfaces of the channel cut layers 53 and 54 by ion implantation or the like.

In the NMOS region, the n-type source/drain regions 81 including n-type impurities such as arsenic of a concentration of approximately $1\times10^{20}$ to $1\times10^{21}$/cm$^3$ are formed in the surface of the semiconductor substrate 1 in which the p-well 41 is formed. The gate insulation film 6 and the gate electrode 7 are formed on the surface of the semiconductor substrate 1.

In the pMOS region, the p-type source/drain regions 82 including p-type impurities such as boron or boron fluoride of a concentration of approximately $1\times10^{20}$ to $1\times10^{21}/cm^3$ are formed in the surface of the semiconductor substrate 1 in which the n-well 42 is formed. The gate insulation film 6 and the gate electrode 7 are formed on the surface of the semiconductor substrate 1.

In both of the pMOS and nMOS regions, the gate insulation film 6 is made of a thermal oxide film having a thickness of approximately 3 to 7 nm or the like.

Formed on a surface of the gate insulation film 6 in the nMOS region is the gate electrode 7 made of a polysilicon layer or the like in a thickness of approximately 150 to 250 nm including n-type impurities such as phosphor or arsenic of a concentration of 2 to $15\times10^{20}/cm^3$. Formed on the surface of the gate insulation film 6 in the pMOS region is the gate electrode 7 made of a polysilicon layer or the like in a thickness of approximately 150 to 250 nm including p-type impurities such as boron or boron fluoride of a concentration of 2 to $15\times10^{20}/cm^3$.

A metal silicide film (not shown) such as cobalt silicide is formed as necessary on a surface of the gate electrode 7 in each region in a thickness of approximately 10 to 20 nm.

Formed next are the metal wirings 92 connected to the source/drain regions 81 and the gate electrode 7 in the nMOS region via the contact hole 91 formed in the interlayer insulation film 9 made of a TEOS (tetraethyl orthosilicate) oxide film or the like. The metal wirings 92 are made of metal such as tungsten, and a barrier metal (not shown) made of TiN for preventing diffusion of metal from the metal wirings 92 is formed between the metal wirings 92 and the gate electrode 7 or the source/drain regions 81.

An interlayer insulation film is further formed, and metal wirings (not shown) connected to the gate electrode 7 and the source/drain regions 82 in the pMOS region are formed.

The metal wirings connected to the source/drain regions 82 and the gate electrode 7 are not necessarily formed in the same layer, but the connection relationship between the wirings and corresponding contact holes varies depending on circuit configuration, and the order of formation may be changed as necessary. Further, wirings connected to the metal wirings 92 with still another interlayer insulation film interposed therebetween may be formed in an upper layer to form a multiplayer interconnection. Materials for the interconnection include polysilicon and metal doped with impurities.

Further, when the source/drain regions are of an LDD (Lightly Doped Drain) structure as needed, the n-type source/drain regions 81 have an impurity region including therein n-type impurities such as phosphor of a concentration of approximately $1\times10^{18}/cm^3$, and the p-type source/drain regions 82 have an impurity region including therein p-type impurities such as boron of a concentration of approximately $1\times10^{18}/cm^3$ (not shown).

Further, as needed, a metal silicide film such as cobalt silicide ($CoSi_2$) is formed in the surfaces of the source/drain regions in a thickness of approximately 30 to 60 nm (not shown).

Although the present embodiment has described an example of interconnection, the number and arrangement of interlayer insulation films formed between wirings and transistors are changed depending on circuit configuration, and needless to say, impurity concentrations and the depth position of impurity concentration peaks are changed in proportion to requirements for transistors and design rules of well isolation.

Voltage applied to respective electrodes are approximately VG=2.5V, VD=2.5V, VS=0V and VB=0V in the nMOS region, while VG=0V, VD=0V, VS=2.5V and VB=2.5V in the pMOS region. These values are only illustrative and vary depending on the gate oxide film thickness and the gate length.

According to the semiconductor device of the present embodiment, even if variation occurs in the depth of the trench to be filled with the insulation film and in the surface height of the isolating insulation film, the channel cut layers are formed in the semiconductor substrate under the insulation film, which allows punch-through between elements to be reduced sufficiently. Consequently, the semiconductor device has good isolation properties. Further, the latch-up is suppressed.

Figure 3:
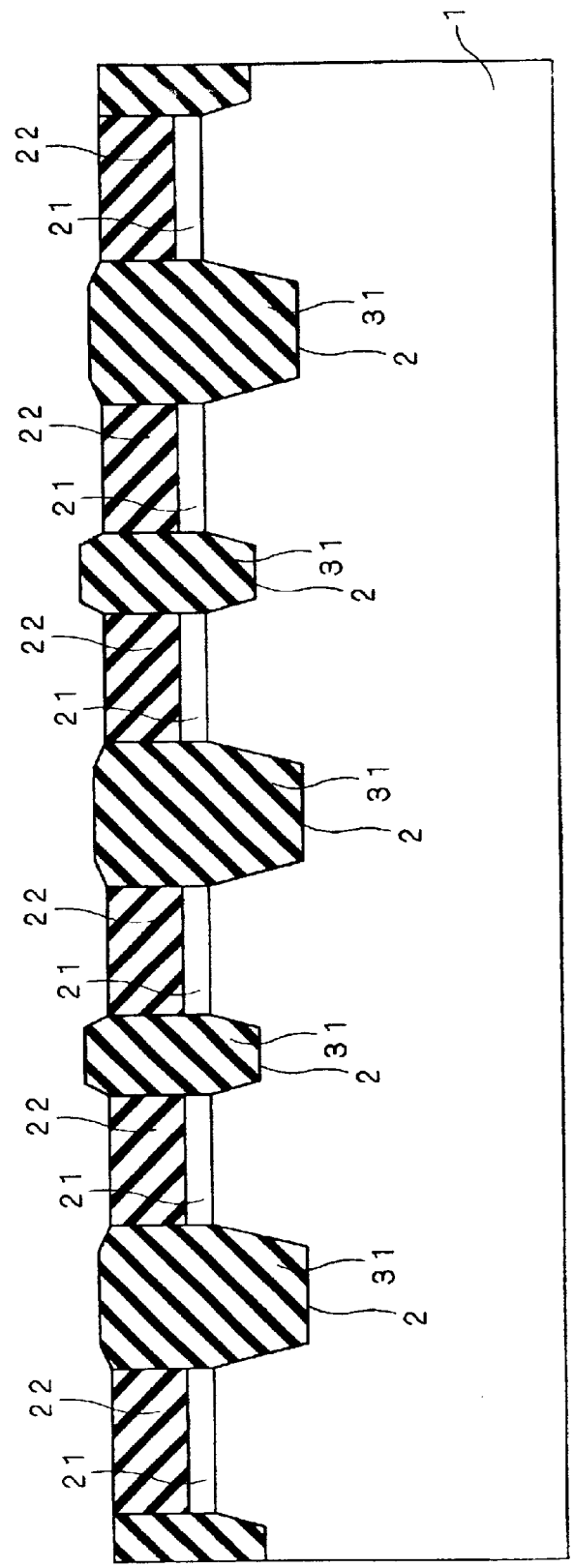
FIGS. 3 to 5 are cross-sectional views showing a step of a method of manufacturing the semiconductor device according to the first preferred embodiment.
Figure 4:
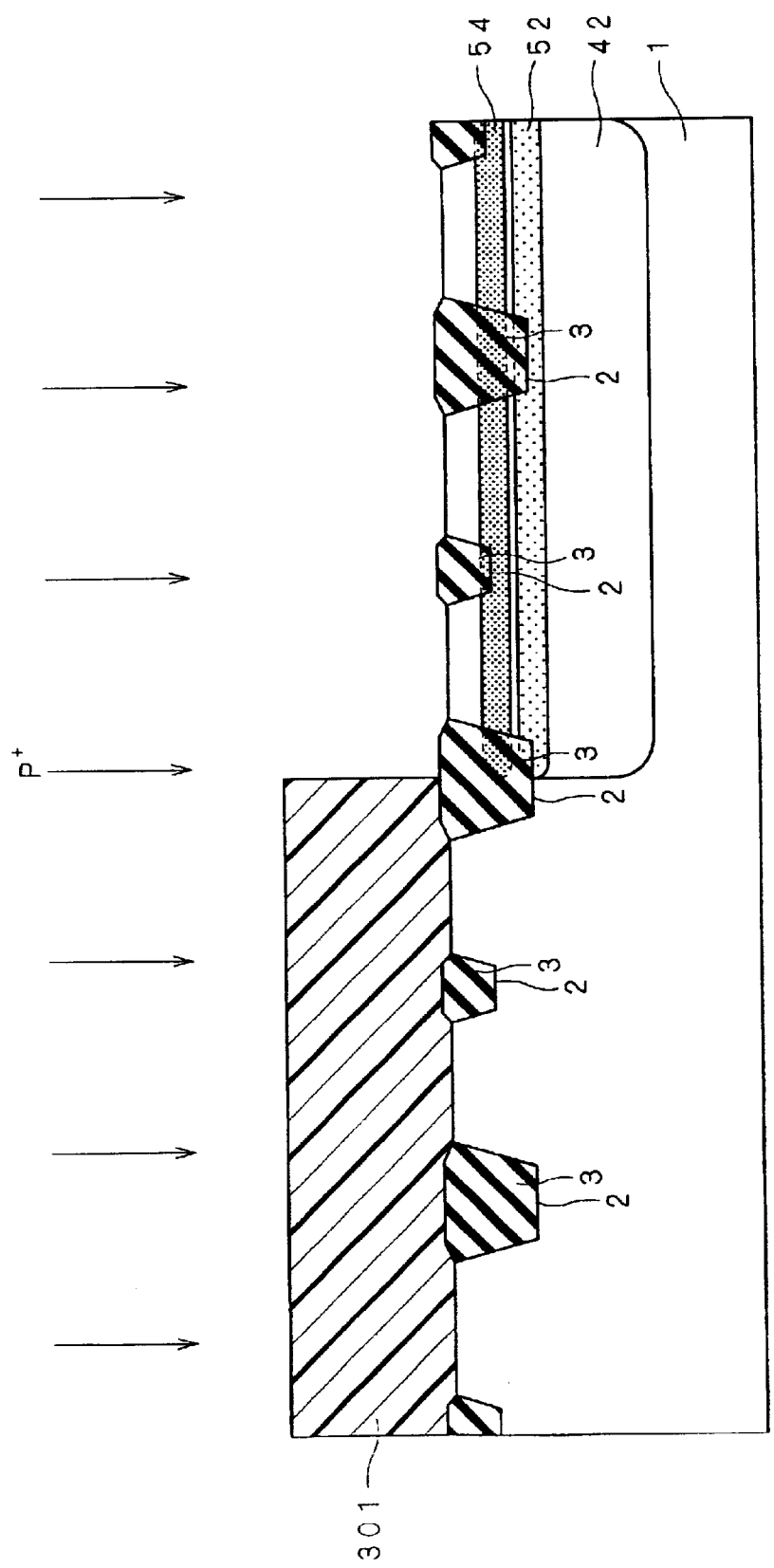
Figure 5:
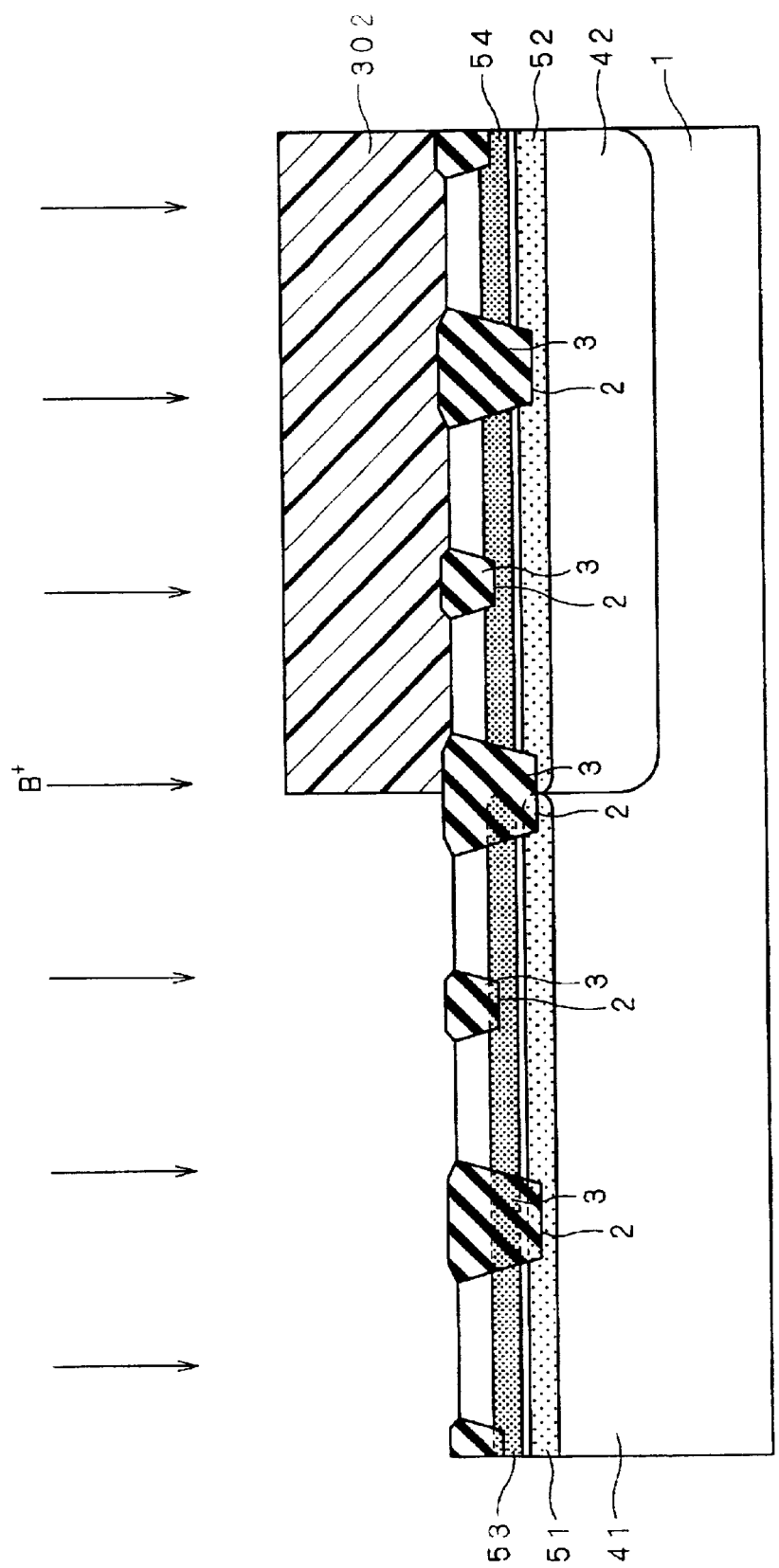

Next, a method of manufacturing the semiconductor device according to the present embodiment will be described. FIGS. 3 to 5 are cross-sectional views each showing a step of the method of manufacturing the semiconductor device according to the present embodiment. FIG. 3 illustrates silicon oxide films 21 and 31, and a silicon nitride film 22. Referring to FIG. 3, the silicon oxide film 21 having a thickness of approximately 10 to 30 nm and the silicon nitride film 22 having a thickness of approximately 100 to 200 nm are formed on the surface of the semiconductor substrate 1. The silicon nitride film 22 and the silicon oxide film 21 on the isolation region are selectively removed by anisotropic etching using a photoresist mask (not shown). After removing the photoresist mask, the semiconductor substrate 1 is subjected to anisotropic etching using the silicon nitride film 22 as a mask, thereby forming the trench 2 having a width of approximately 200 to 500 nm and a depth of approximately 200 to 400 nm in the surface of the semiconductor substrate 1.

Next, an insulation film such as the silicon oxide film 31 is formed on the entire surface in a thickness of approximately 300 to 600 nm using a low-pressure CVD technique. The silicon oxide film 31 on a surface of the silicon nitride film 22 is removed by the CMP method using the silicon nitride film 22 as a stopper or wet etching or dry etching or combination of these techniques, thereby leaving the silicon oxide film 31 only in the insides of the trench 2 and the openings of the silicon oxide film 21 and the silicon nitride film 22. FIG. 3 shows elements of the semiconductor device at a stage upon completion of this step.

FIG. 4 illustrates a photoresist mask 301.

Referring to FIG. 4, after removing the silicon nitride film 22 by wet etching using thermal phosphate, the silicon oxide film 21 is removed to form the isolating insulation film 3.

The photoresist mask 301 having an opening on the surface of the pMOS region is then formed in a thickness of approximately 1 to 3 μm, and n-type impurities such as phosphor are introduced by ion implantation at an energy of 200 keV to 1 MeV and a dose of approximately $5\times10^{12}$ to $5\times10^{13}/cm^2$, thereby forming the n-well 42.

Thereafter, n-type impurities such as phosphor are further introduced by ion implantation at an energy of 60 keV to 100 keV and a dose of approximately $1\times10^{12}$ to $1\times10^{13}/cm^2$ to form the channel cut layer 54, and at an energy of 100 keV to 160 keV and a dose of approximately $1\times10^{12}$ to $1\times10^{13}/cm^2$ to form the channel cut layer 52. FIG. 4 shows the elements of the semiconductor device at a stage upon completion of this step.

FIG. 5 illustrates a photoresist mask 302.

Referring to FIG. 5, the photoresist mask 302 having an opening on the surface of the nMOS region is then formed in a thickness of approximately 1 to 3 μm, and p-type impurities such as boron are introduced by ion implantation at an energy of 400 keV to 2 MeV and a dose of approximately $5\times10^{12}$ to $5\times10^{13}/cm^2$, thereby forming the p-well 41.

Thereafter, p-type impurities such as boron are further introduced by ion implantation at an energy of 120 keV to 220 keV and a dose of approximately $1\times10^{12}$ to $1\times10^{13}/cm^2$ to form the channel cut layer 53, and at an energy of 220 keV to 320 keV and a dose of approximately $1\times10^{12}$ to $1\times10^{13}/cm^2$ to form the channel cut layer 51. FIG. 5 shows the elements of the semiconductor device at a stage upon completion of this step.

Thereafter, a silicon oxide film is formed in a thickness of approximately 1 to 10 nm by thermal oxidation, where a polysilicon layer is formed in a thickness of approximately 100 to 200 nm and is patterned, thereby forming the gate insulation films 6 and the gate electrodes 7.

An insulation film such as a silicon oxide film is then formed on the entire surface using the CVD method and is etched back to form the sidewall insulation films 71. The sidewall insulation films 71 are formed as necessary, and may not be formed in some cases.

Next, a photoresist mask (not shown) having an opening on the surface of the pMOS region is formed, and p-type impurities such as boron are introduced by ion implantation at an energy of 1 keV to 10 keV and a dose of approximately $5\times10^{15}$ to $5\times10^{16}/cm^2$ to form the p-type source/drain regions 82. After removing the photoresist mask, another photoresist mask (not shown) having an opening on the surface of the nMOS region is formed, and n-type impurities such as arsenic are introduced by ion implantation at an energy of 20 keV to 100 keV and a dose of approximately $5\times10^{15}$ to $5\times10^{16}/cm^2$ to form the n-type source/drain regions 81.

Ion implantation may be performed for the wells, the channel cut layers and the source/drain regions first in either of the pMOS region and the nMOS region. Further, ion implantation for the two channel cut layers and the wells in each region may be performed in any order.

Next, the interlayer insulation film 9 such as a PSG film, a BPSG film, a TEOS (tetraethyl orthosilicate) film is deposited in a thickness of approximately 200 to 600 nm using the low-pressure CVD method. The contact hole 91 reaching the n-type source/drain regions 81 and the gate electrodes 7 in the NMOS region is opened with a diameter of 0.1 to 0.5 $\mu$m by dry etching. Thereafter, a barrier metal (not shown) such as a titanium nitride (TiN) film having a thickness of approximately 50 nm is deposited on the entire surface, following which a metal film such as a tungsten (W) film having a thickness of approximately 100 nm is formed, and these films are patterned to form the metal wirings 92. As has been described, the semiconductor device shown in FIG. 1 is obtained in this way.

Thereafter, the interlayer insulation film and metal wirings connected to the gate electrodes 7 and the p-type source/drain regions 82 in the pMOS region are further formed, thereby completing the semiconductor device according to the present embodiment.

With the method of manufacturing the semiconductor device according to the present embodiment, the channel cut layers of sufficient impurity concentrations are formed in the semiconductor substrate under the isolating insulation film even if variation occurs in forming a trench in the isolation region and in planarizing after filling the trench with insulation films. Thus, the semiconductor device is manufactured to have good isolation properties without causing an increase in junction capacitance and junction leakage current by unnecessarily increasing impurity concentrations.

Second Preferred Embodiment

Figure 6:
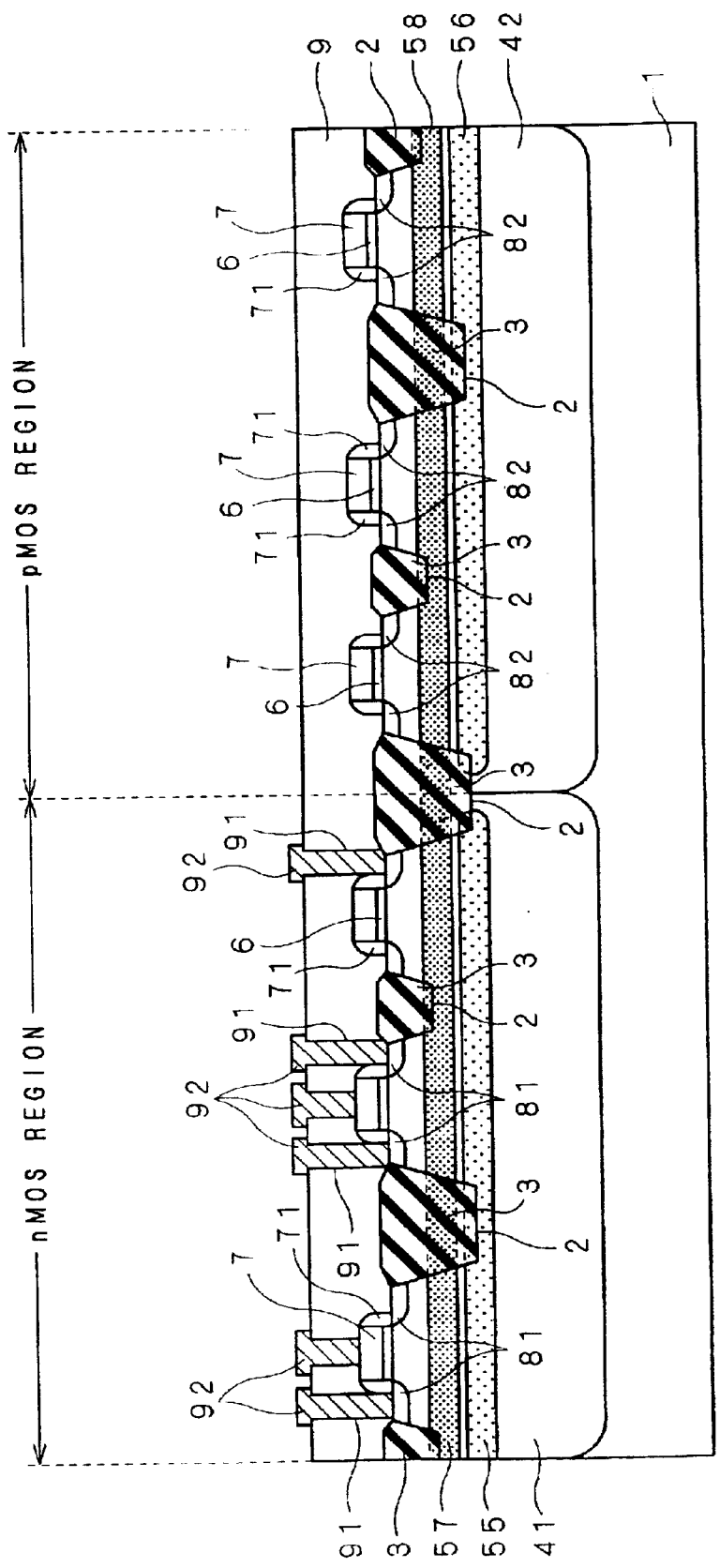
FIGS. 6 to 8 are cross-sectional views showing a semiconductor device according to a second preferred embodiment of the invention.
Figure 7:
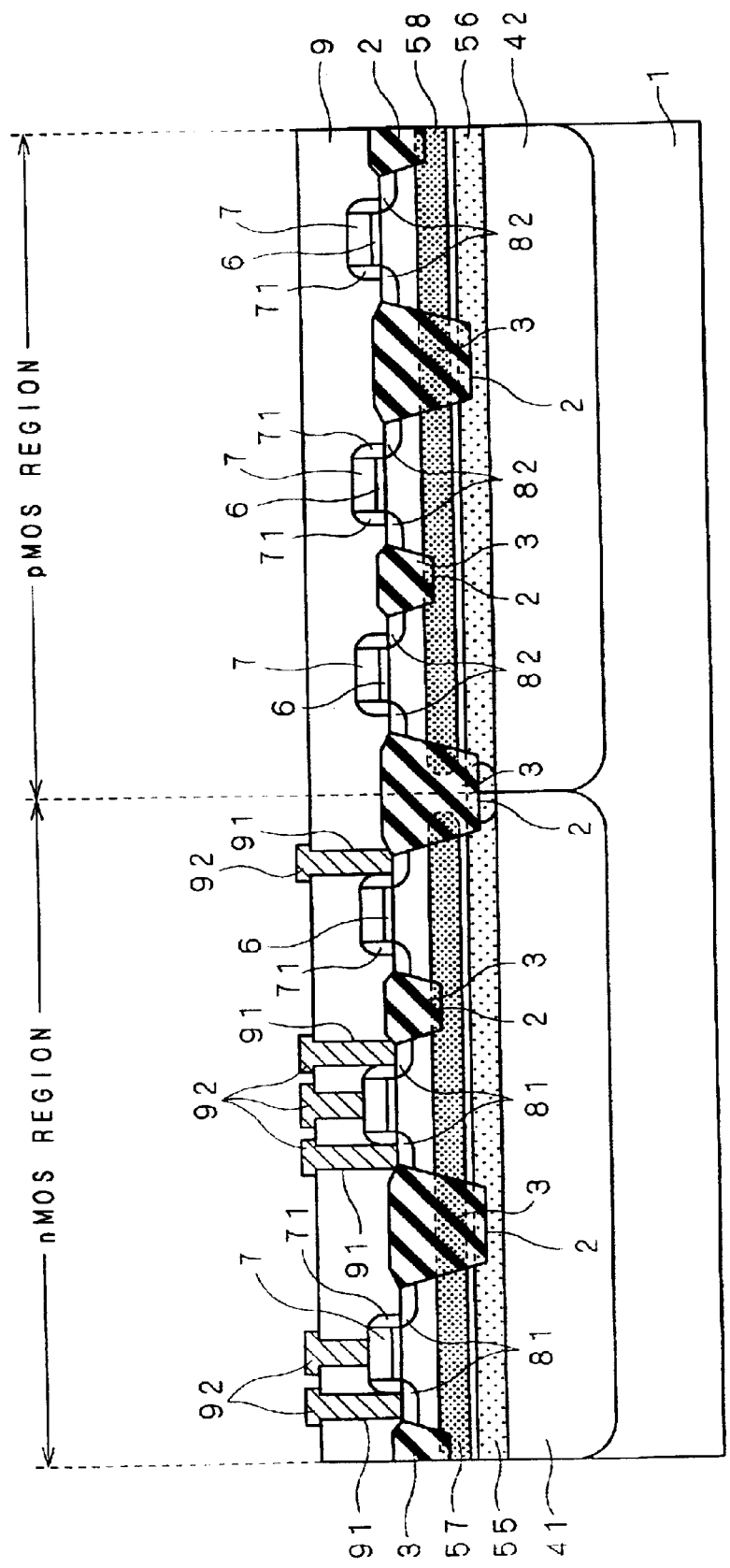
Figure 8:
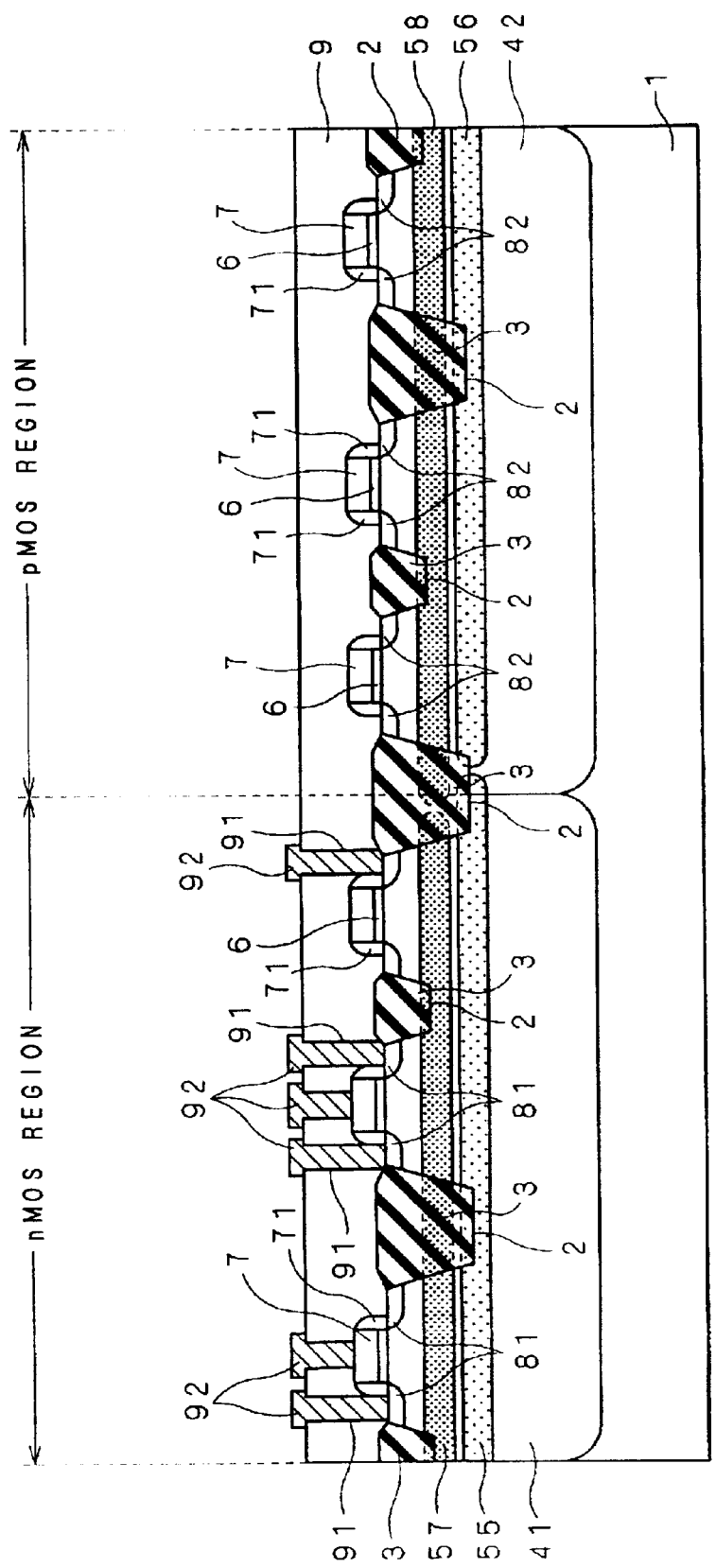

FIGS. 6 to 8 are cross-sectional views showing a semiconductor device according to a second preferred embodiment. These drawings illustrate channel cut layers 55 to 58. Referring to FIG. 6, the channel cut layers 57 and 55 are formed in the nMOS region in place of the channel cut layers 53 and 51 shown in FIG. 1, respectively. The channel cut layers 58 and 56 are formed in the pMOS region in place of the channel cut layers 54 and 52 shown in FIG. 1, respectively. The semiconductor device of the present embodiment has the same structure as that described in the first preferred embodiment, except for these channel cut layers.

The channel cut layers 57 and 55 each include impurities such as boron with a concentration peak of approximately $1\times10^{17}$ to $1\times10^{18}/cm^3$. The channel cut layers 58 and 56 each include impurities such as boron with a concentration peak of approximately $1\times10^{17}$ to $1\times10^{18}/cm^3$. The channel cut layers 57 and 58 are formed to have their impurity concentration peaks at a depth of approximately 240 to 270 nm, and the channel cut layers 55 and 56 are formed to have their impurity concentration peaks at a depth of approximately 330 to 360 nm, similarly to the first preferred embodiment in this regard as well.

The channel cut layers 55 to 58 differ from the channel cut layers 51 to 54 described in the first preferred embodiment in arrangement in the horizontal direction. The channel cut layers 55 and 57 in the NMOS region are shifted in opposite directions to each other with respect to the active region defined by the isolating insulation film 3. The channel cut layers 56 and 58 in the pMOS region are shifted in opposite directions to each other with respect to the active region defined by the isolating insulation film 3.

Figure 9:
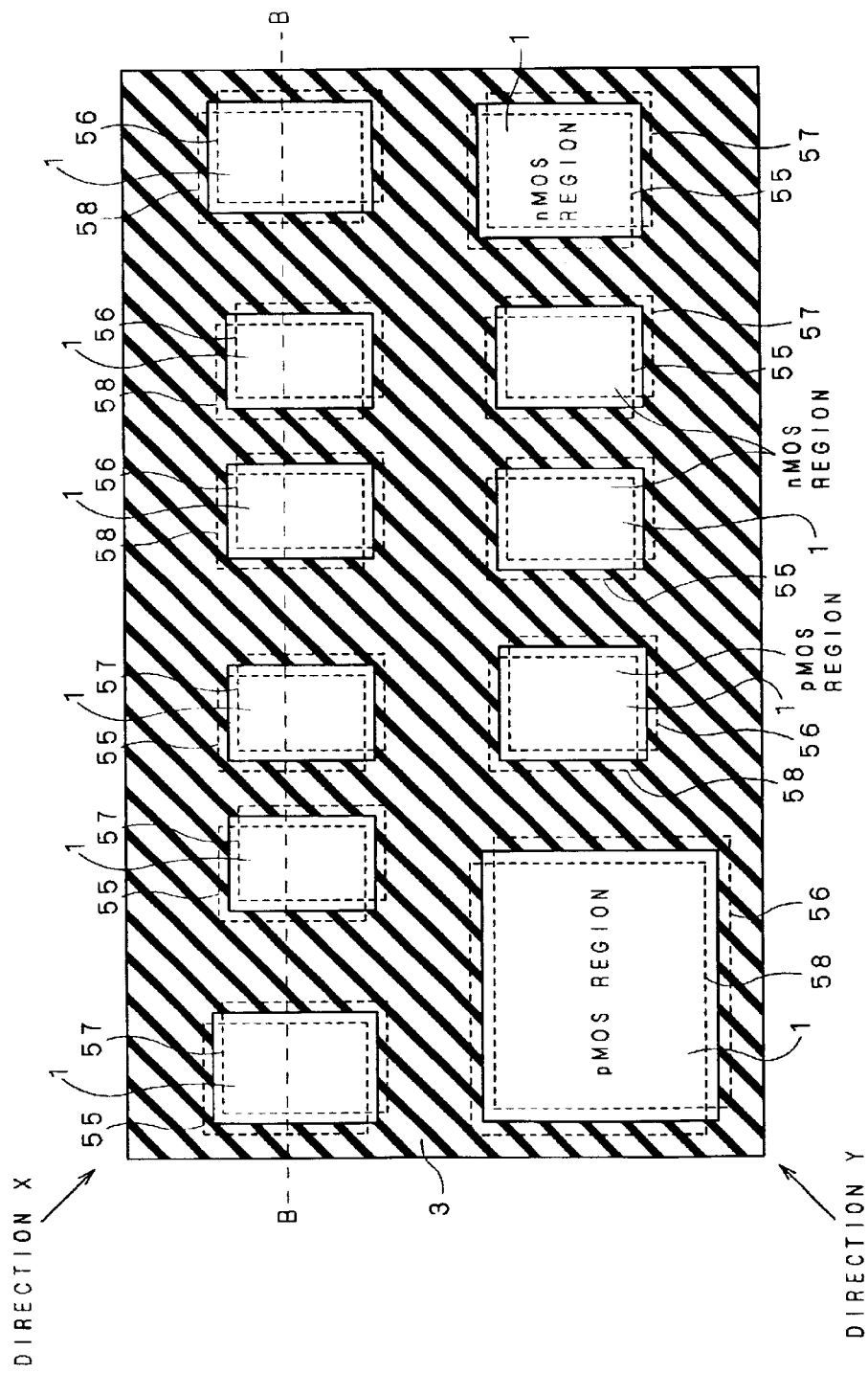
FIG. 9 is a top view showing the semiconductor device according to the second preferred embodiment.

FIG. 9 is a top view of the semiconductor device according to the present embodiment, showing the arrangement of the channel cut layers shown in the cross-sectional view of FIG. 6. FIG. 6 shows the elements appearing in a cross-sectional view taken along the line B—B in FIG. 9. Referring to FIG. 9, the channel cut layers 55 to 58 are formed in regions indicated by broken lines, respectively. The channel cut layers 57 and 56 are shifted in a direction X, and the channel cut layers 55 and 58 are shifted in the opposite direction to the direction X. Here, the direction X forms an angle of 45° with respect to the direction of a gate length.

The semiconductor device shown in FIG. 7 illustrates the channel cut layers 56 and 57 shifted in the opposite direction to the direction X shown in FIG. 9 and the channel cut layers 55 and 58 shifted in the direction X. The semiconductor device shown in FIG. 8 illustrates the channel cut layers 55 and 56 shifted in the direction X shown in FIG. 9 and the channel cut layers 57 and 58 shifted in the opposite direction to the direction X.

Provided that the channel cut layers 56 and 58 are shifted in opposite directions to each other, respectively, these layers may be shifted in any of the direction X, Y and the opposite direction to the direction X or Y. Although the direction of shift is the direction X or Y in general, it is not limited to either of these directions. Here, the direction Y is perpendicular to the direction X. The same applies to the channel cut layers 55 and 57.

Figure 10:
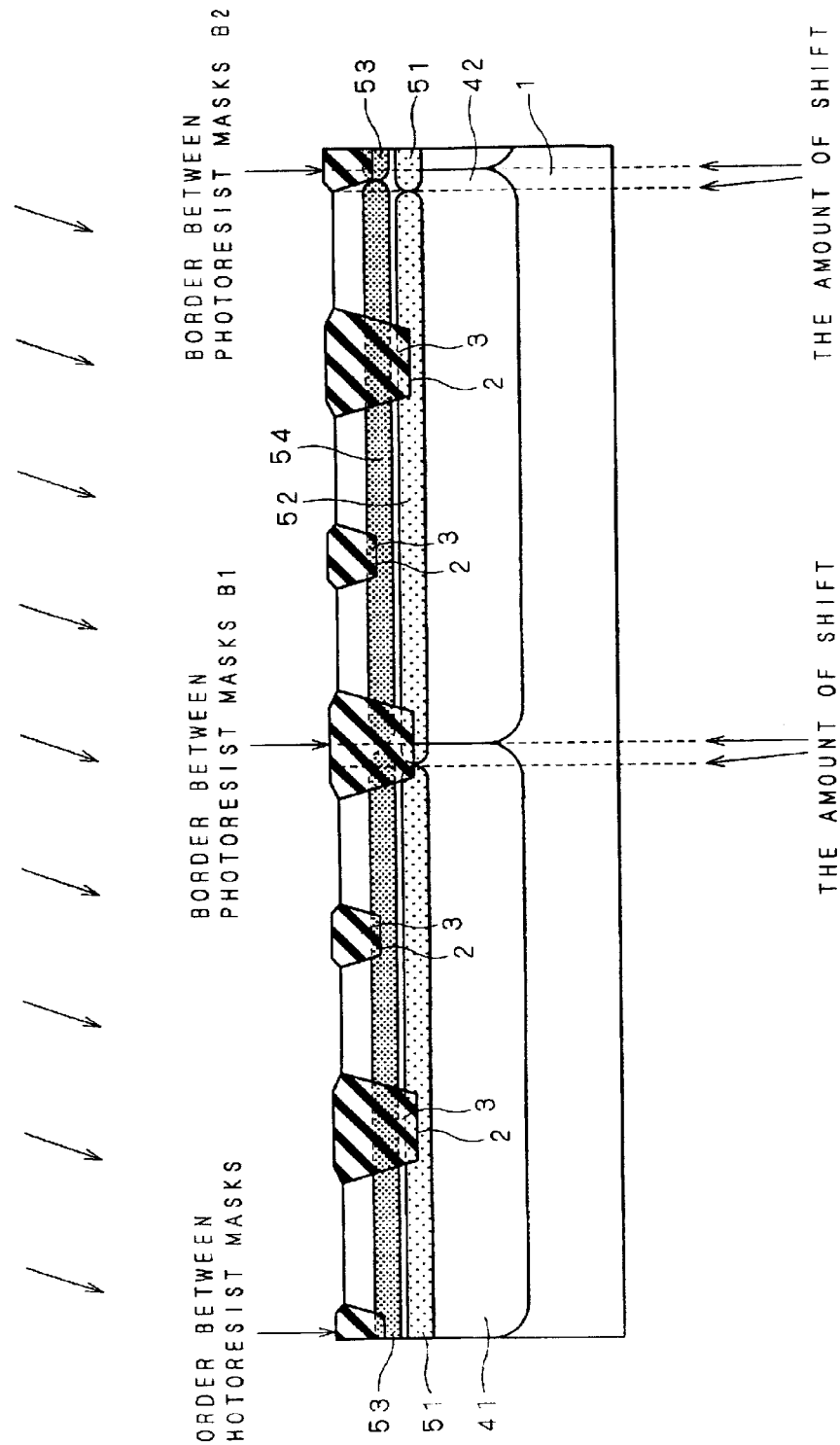
FIG. 10 is a cross-sectional view showing the semiconductor device according to the second preferred embodiment.

FIG. 10 is a cross-sectional view of the semiconductor device for explaining the present embodiment. Referring to FIG. 10, ion implantation is generally performed at an angle of approximately 7° in order to prevent channeling in forming each channel cut layer. This may arise a problem with the semiconductor device described in the first preferred embodiment that oblique ion implantation performed for the channel cut layers 51 and 53 in the NMOS region and the channel cut layers 52 and 54 in the pMOS region at an angle of approximately 7° in the same direction causes the border between substantial nMOS and pMOS regions to be shifted from a designed position with respect to the border between photoresist masks as shown in the drawing. This reduces, at a border B1 between photoresist masks, an effective isolation width between the source/drain regions formed in the nMOS region and the channel cut layers 52, 54 in the pMOS region, and at a border B2 between photoresist masks, an effective isolation width between the source/drain regions formed in the pMOS region and the channel cut layers 51, 53 formed in the nMOS region provided on the opposite side to the p-well 41 with the pMOS region interposed therebetween.

In the semiconductor device according to the present embodiment, the two channel cut layers 55 and 57 in the nMOS region and the two channel cut layers 56 and 58 in the pMOS region are shifted in opposite directions to each other, respectively. Thus, the channel cut layers 55 and 57 and the channel cut layers 56 and 58 are provided in a not-one-sided and balanced manner. At this time, impurities cancel each other out in regions where the channel cut layers 57 and 58 are superimposed as shown in FIG. 6 and the channel cut layers 55 and 56 are superimposed as shown in FIG. 7. Therefore, the amount of shifts of the pMOS region and the nMOS region is reduced, respectively, which allows effective isolation widths to be maintained sufficiently. Consequently, the semiconductor device has good isolation properties.

Further, the channel cut layers are formed in the semiconductor substrate under the isolating insulation film even in the semiconductor device with variation in the depth of the trench to be filled with isolating insulation films and in the surface height of isolating insulation films as in the first preferred embodiment. This allows punch-through between elements to be reduced sufficiently. Consequently, the semiconductor device has good isolation properties.

Next, a method of manufacturing the semiconductor device according to the second preferred embodiment will be described.

Figure 11:
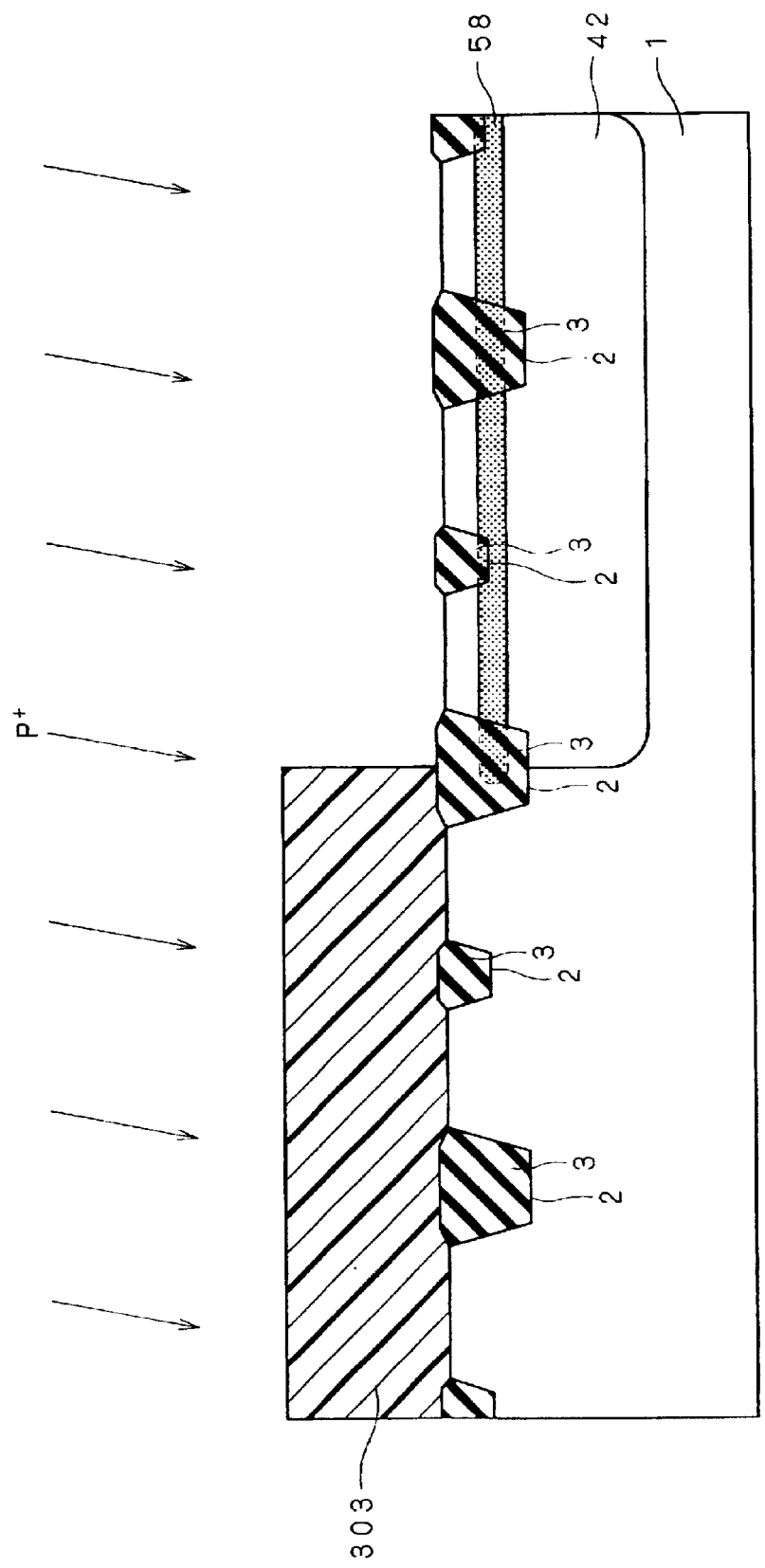
FIGS. 11 to 14 are cross-sectional views showing a step of a method of manufacturing the semiconductor device according to the second preferred embodiment.

FIGS. 11 to 14 are cross-sectional views each showing a step of the method of manufacturing the semiconductor device according to the present embodiment. FIG. 11 shows a photoresist mask 303. Referring to FIG. 11, similarly to the first preferred embodiment, the trench 2 is first formed in the surface of the semiconductor substrate 1 and the isolating insulation film 3 is then formed, after which the photoresist mask 303 is formed to cover the surface of the nMOS region.

Next, the n-well 42 is formed similarly to the first preferred embodiment, after which n-type impurities such as phosphor are introduced by oblique ion implantation at an energy of 60 keV to 100 keV and a dose of approximately $1\times10^{12}$ to $1\times10^{13}/cm^2$ at an angle of approximately 7°, thereby forming the channel cut layer 58. This angle is made, for example, in the direction X shown in FIG. 9. FIG. 11 shows the elements of the semiconductor device in this step.

Figure 12:
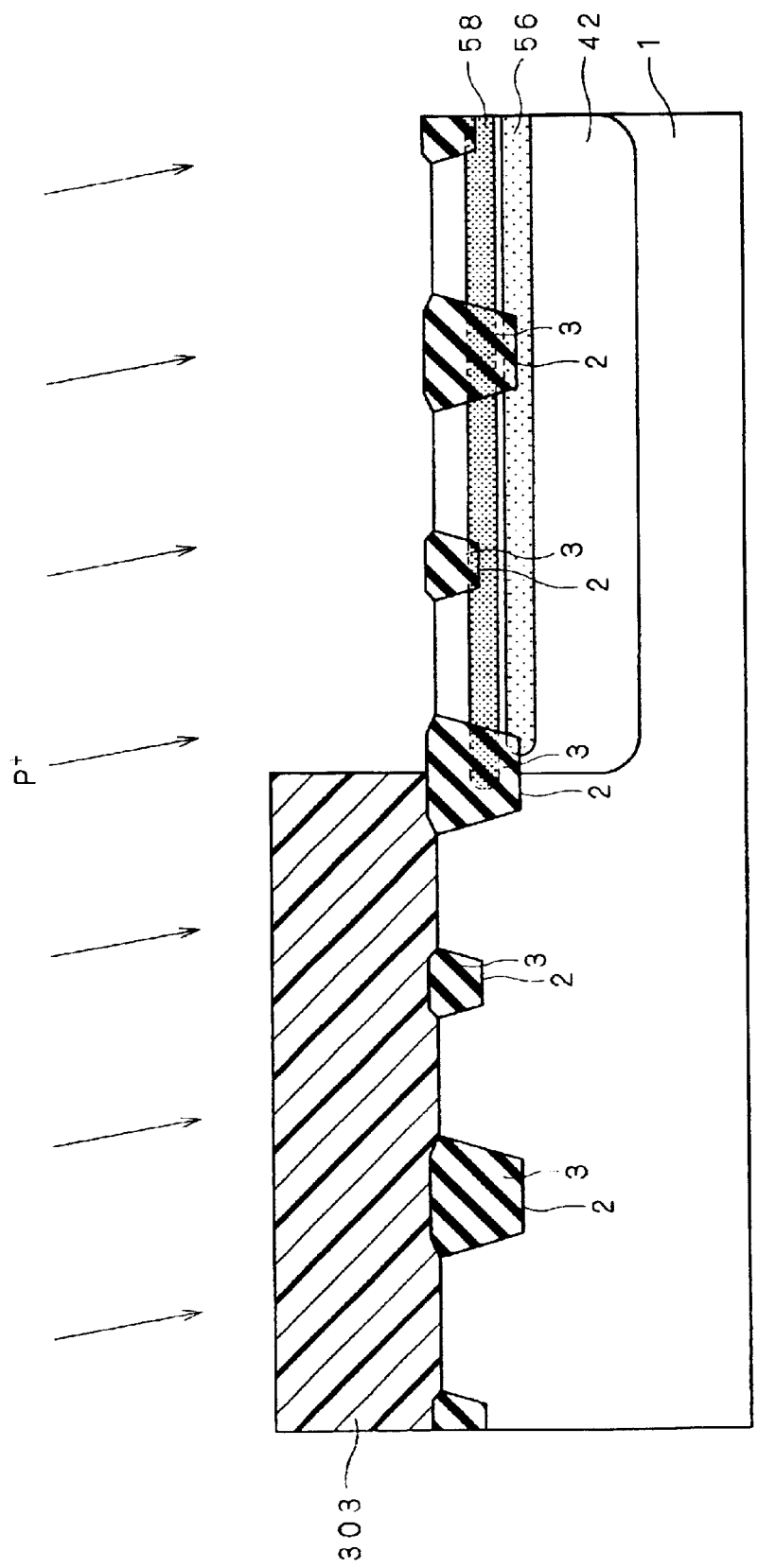

Referring next to FIG. 12, n-type impurities such as phosphor are introduced by oblique ion implantation at an energy of 100 keV to 160 keV and a dose of approximately $1\times10^{12}$ to $1\times10^{13}/cm^2$ at an angle of approximately 7°, thereby forming the channel cut layer 56. This angle is made, for example, in the opposite direction to the direction X shown in FIG. 9. FIG. 12 shows the elements of the semiconductor device in this step.

Figure 13:
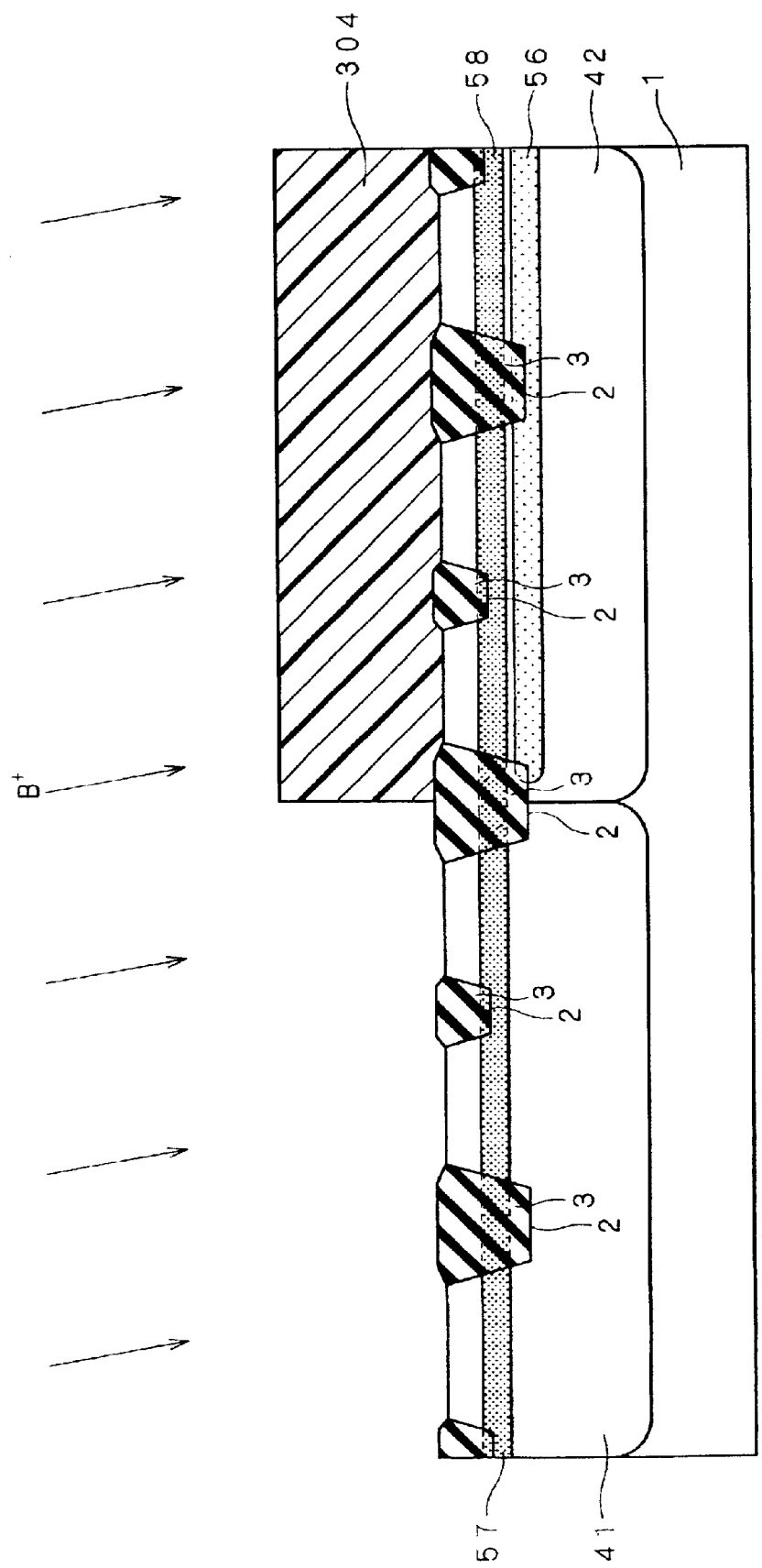

FIG. 13 shows a photoresist mask 304.

Referring to FIG. 13, after forming the photoresist mask 304 which covers the surface of the pMOS region, the p-well 41 is formed similarly to the first preferred embodiment. Next, p-type impurities such as boron are introduced by oblique ion implantation at an energy of 60 keV to 100 keV and a dose of approximately $1\times10^{12}$ to $1\times10^{13}/cm^2$ at an angle of approximately 7°, thereby forming the channel cut layer 57. This angle is made, for example, in the opposite direction to the direction X shown in FIG. 9. FIG. 13 shows the elements of the semiconductor device in this step.

Figure 14:
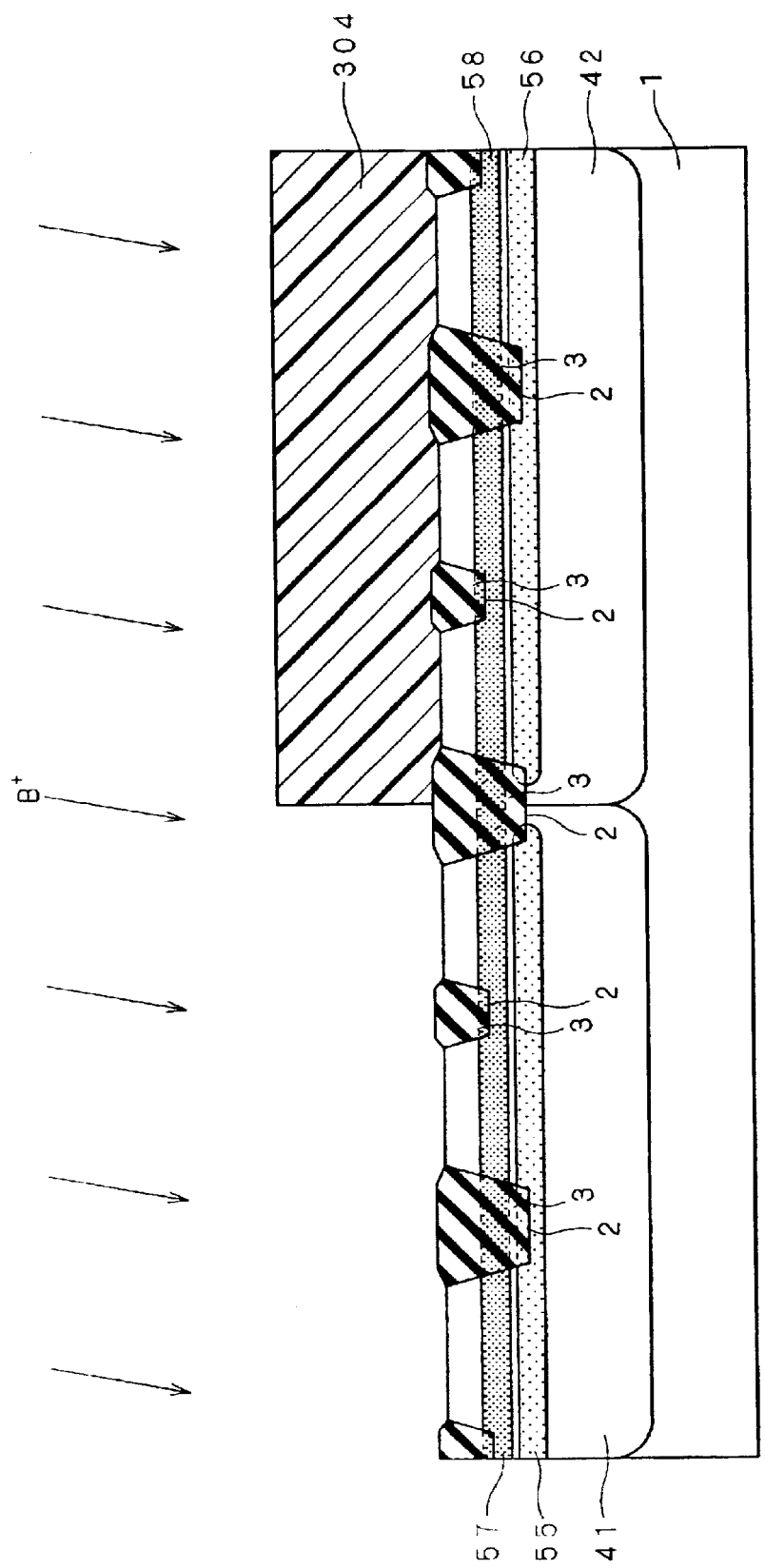
Figure 15:
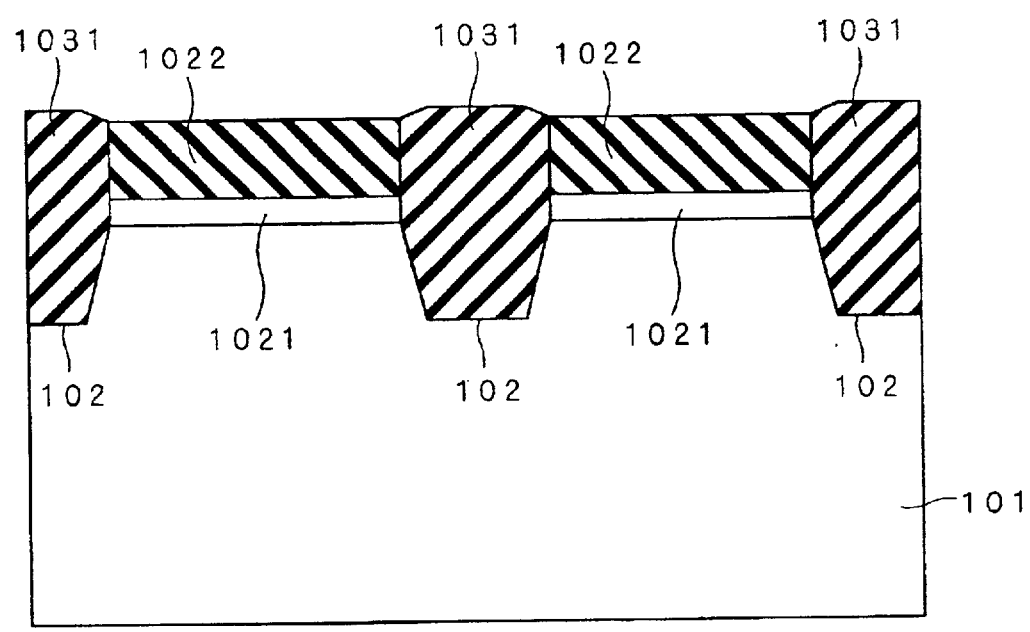
FIGS. 15 and 16 are cross-sectional views showing a step of a method of manufacturing a conventional semiconductor device.
Figure 16:
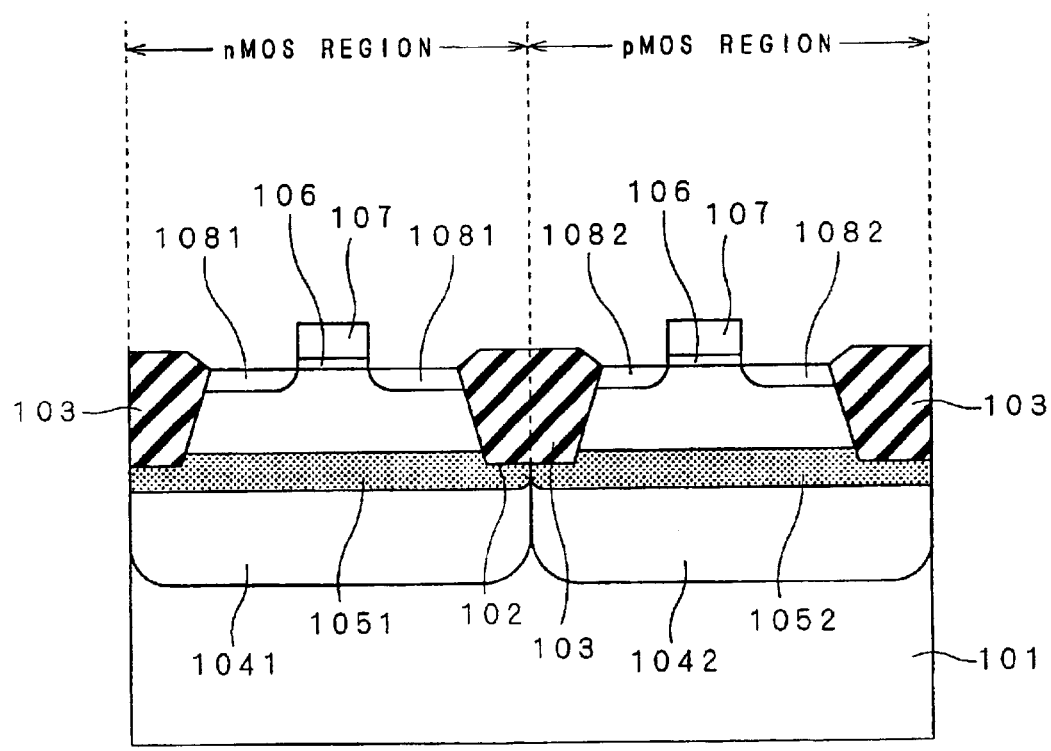

Referring next to FIG. 14, p-type impurities such as boron are introduced by oblique ion implantation at an energy of 100 keV to 160 keV and a dose of approximately $1\times10^{12}$ to $1\times10^{13}/cm^2$ at an angle of approximately 7°, thereby forming the channel cut layer 55. This angle is made, for example, in the direction X shown in FIG. 9. FIG. 14 shows the elements of the semiconductor device in this step.

Thereafter, the gate insulation film 6 and the gate electrode 7 are formed similarly to the first preferred embodiment, and the sidewall insulation film 71 is formed as necessary.

The p-type source/drain regions 82 and the n-type source/drain regions 81 are formed similarly to the first preferred embodiment.

Ion implantation for the wells, the channel cut layers and the source/drain regions may be performed first in either of the pMOS region and the nMOS region. Further, ion implantation for the two channel cut layers and the wells in each region may be performed in any order.

Next, similarly to the first preferred embodiment, after depositing the interlayer insulation film 9, the contact hole 91 reaching the n-type source/drain regions 81 and the gate electrode 7 in the nMOS region is formed and the barrier metal is deposited, after which the metal wirings 92 are formed. The semiconductor device shown in FIG. 6 is thereby obtained.

Thereafter, the interlayer insulation film and metal wirings connected to the gate electrodes 7 and the p-type source/drain regions 82 in the pMOS region are further formed, thereby completing the semiconductor device according to the present embodiment.

When forming the semiconductor device shown in FIG. 7, the channel cut layers 56 and 57 shall be formed by oblique ion implantation in the opposite direction to the direction X shown in FIG. 9, and the channel cut layers 55 and 58 shall be formed by oblique ion implantation in the direction X shown in FIG. 9.

When forming the semiconductor device shown in FIG. 8, the channel cut layers 55 and 56 shall be formed by oblique ion implantation in the direction X shown in FIG. 9, and the channel cut layers 57 and 58 shall be formed by oblique ion implantation in the opposite direction to the direction X shown in FIG. 9.

Although the present embodiment has described the case of performing oblique ion implantation in the direction X shown in FIG. 9 and the opposite direction thereto, oblique ion implantation may be performed in any of the direction X, Y and the opposite direction to the direction X or Y, provided that it is performed for the channel cut layers 55 and 57 in opposite directions to each other and for the channel cut layers 56 and 58 in opposite directions to each other. Further, although the direction in which a wafer is inclined is generally the direction X or Y shown in FIG. 9, it is not limited to either of these directions.

According to the method of the second preferred embodiment, the two channel cut layers 55 and 57 in the nMOS region and the two channel cut layers 56 and 58 in the pMOS region are shifted in opposite directions to each other, respectively. This allows the amount of shifts of the pMOS region and the nMOS region to be reduced respectively, so that effective isolation widths are maintained sufficiently. Consequently, the semiconductor device has good isolation properties.

Further, similarly to the first preferred embodiment, the channel cut layers of sufficient impurity concentrations are formed in the semiconductor substrate under the isolating insulation film even if variation occurs in forming a trench in the isolation region and in planarizing after filling the trench with insulation films. Consequently, the semiconductor device is manufactured to have good isolation properties without causing an increase in junction capacitance and junction leakage current by unnecessarily increasing impurity concentrations.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a semiconductor substrate;
   a first semiconductor region of a first conductivity type provided in a main surface of said semiconductor substrate;
   an isolating insulation film provided in said main surface of said semiconductor substrate for separating said first semiconductor region into a plurality of active regions, said isolating insulation film having a bottom surface including first and second bottoms provided at first and second depths different from each other;
   a first channel cut layer of said first conductivity type provided in a vicinity of said first bottom at said first depth in said first semiconductor region;
   a second channel cut layer of said first conductivity type provided in a vicinity of said second bottom at said second depth in said first semiconductor region; and
   a plurality of MOS transistors of a second conductivity type, each being formed at a main surface of each of said plurality of active regions, wherein
   at least one of said first and second channel cut layers extends under said plurality of MOS transistors.

2. The semiconductor device according to claim 1, wherein
   said first and second channel cut layers are shifted in opposite directions to each other in a horizontal direction with respect to said plurality of active regions.

3. The semiconductor device according to claim 2, wherein
   said first and second channel cut layers are shifted in a direction forming an angle of approximately 45° with respect to a direction of a gate length of at least one of said plurality of MOS transistors.

4. The semiconductor device according to claim 1, further comprising;
   a second semiconductor region of said second conductivity type provided in a region different from said first semiconductor region in said main surface of said semiconductor substrate, said second semiconductor region being separated into a plurality of active regions by said isolating insulation film,
   a third channel cut layer of said second conductivity type provided in a vicinity of said first bottom at said first depth in said second semiconductor region;
   a fourth channel cut layer of said second conductivity type provided in a vicinity of said second bottom at said second depth in said second semiconductor region; and
   a plurality of MOS transistors of said first conductivity type, each being formed at a main surface of each of said plurality of active regions in said second semiconductor regions, wherein
   at least one of said third and fourth channel cut layers extends under said plurality of MOS transistors.

5. The semiconductor device according to claim 4, wherein
   said first and second channel cut layers are shifted in opposite directions to each other in a horizontal direction with respect to said plurality of active regions where said plurality of MOS transistors of said second conductivity type are formed, and
   said third and fourth channel cut layers are shifted in opposite directions to each other in a horizontal direction with respect to said plurality of active regions where said plurality of MOS transistors of said first conductivity type are formed.

6. The semiconductor device according to claim 5, wherein said first and third channel cut layers are shifted in opposite directions to each other in a horizontal direction with respect to said plurality of active regions where said plurality of MOS transistors of said first and second conductivity types are formed.

7. The semiconductor device according to claim 6, wherein
   said first to fourth channel cut layers are shifted in a direction forming an angle of approximately 45° with respect to a direction of a gate length of at least one of said plurality of MOS transistors.

8. The semiconductor device according to claim 5, wherein
   said first to fourth channel cut layers are shifted in a direction forming an angle of approximately 45° with respect to a direction of a gate length of at least one of said plurality of MOS transistors.

9. A semiconductor device comprising:
   a first semiconductor region of a first conductivity type provided in a main surface of a semiconductor substrate;
   an isolating insulation film provided in said main surface of said semiconductor substrate for separating said first semiconductor region into a plurality of active regions, said isolating insulation film having a bottom surface including first and second bottoms provided at first and second depths different from each other;
   a first channel cut layer of said first conductivity type provided in a vicinity of said first bottom at said first depth in said first semiconductor region;
   a second channel cut layer of said first conductivity type provided in a vicinity of said second bottom at said second depth in said first semiconductor region; and
   a plurality of MOS transistors of a second conductivity type, each being formed at a main surface of each of said plurality of active regions, wherein
   said first and second channel cut layers are shifted in opposite directions to each other in a horizontal direction with respect to said plurality of active regions, and
   said first and second channel cut layers are shifted in a direction forming an angle of approximately 45° with respect to a direction of a gate length of at least one of said plurality of MOS transistors.

10. A semiconductor device comprising:
    a first semiconductor region of a first conductivity type provided in a main surface of a semiconductor substrate;
    an isolating insulation film provided in said main surface of said semiconductor substrate for separating said first semiconductor region into a plurality of active regions, said isolating insulation film having a bottom surface including first and second bottoms provided at first and second depths different from each other;

a first channel cut layer of said first conductivity type provided in a vicinity of said first bottom at said first depth in said first semiconductor region;

a second channel cut layer of said first conductivity type provided in a vicinity of said second bottom at said second depth in said first semiconductor region;

a plurality of MOS transistors of a second conductivity type, each being formed at a main surface of each of said plurality of active regions;

a second semiconductor region of said second conductivity type provided in a region different from said first semiconductor region in said main surface of said semiconductor substrate, said second semiconductor region being separated into a plurality of active regions by said isolating insulation film;

a third channel cut layer of said second conductivity type provided in a vicinity of said first bottom at said first depth in said second semiconductor region;

a fourth channel cut layer of said second conductivity type provided in a vicinity of said second bottom at said second depth in said second semiconductor region; and a plurality of MOS transistors of said first conductivity type, each being formed at a main surface of each of said plurality of active regions in said second semiconductor region, wherein said first and second channel cut layers are shifted in opposite directions to each other in a horizontal direction with respect to said plurality of active regions where said plurality of MOS transistors of said second conductivity type are formed, said third and fourth channel cut layers are shifted in opposite directions to each other in a horizontal direction with respect to said plurality of active regions where said plurality of MOS transistors of said first conductivity type are formed, and said first to fourth channel cut layers are shifted in a direction forming an angle of approximately 45° with respect to a direction of a gate length of at least one of said plurality of MOS transistors.

11. A semiconductor device comprising:

a first semiconductor region of a first conductivity type provided in a main surface of a semiconductor substrate;

an isolating insulation film provided in said main surface of said semiconductor substrate for separating said first semiconductor region into a plurality of active regions, said isolating insulation film having a bottom surface including first and second bottoms provided at first and second depths different from each other;

a first channel cut layer of said first conductivity type provided in a vicinity of said first bottom at said first depth in said first semiconductor region;

a second channel cut layer of said first conductivity type provided in a vicinity of said second bottom at said second depth in said first semiconductor region;

a plurality of MOS transistors of a second conductivity type, each being formed at a main surface of each of said plurality of active regions;

a second semiconductor region of said second conductivity type provided in a region different from said first semiconductor region in said main surface of said semiconductor substrate, said second semiconductor region being separated into a plurality of active regions by said isolating insulation film;

a third channel cut layer of said second conductivity type provided in a vicinity of said first bottom at said first depth in said second semiconductor region;

a fourth channel cut layer of said second conductivity type provided in a vicinity of said second bottom at said second depth in said second semiconductor region; and a plurality of MOS transistors of said first conductivity type, each being formed at a main surface of each of said plurality of active regions in said second semiconductor region. wherein said first and second channel cut layers are shifted in opposite directions to each other in a horizontal direction with respect to said plurality of active regions where said plurality of MOS transistors of said second conductivity type are formed, said third and fourth channel cut layers are shifted in opposite directions to each other in a horizontal direction with respect to said plurality of active regions where said plurality of MOS transistors of said first conductivity type are formed, said first and third channel cut layers are shifted in opposite directions to each other in a horizontal direction with respect to said plurality of active regions where said plurality of MOS transistors of said first and second conductivity types are formed, and said first to fourth channel cut layers are shifted in a direction forming an angle of approximately 45° with respect to a direction of a gate length of at least one of said plurality of MOS transistors.

* * * * *